United States Patent
Shimizu

(10) Patent No.: US 10,429,446 B2
(45) Date of Patent: Oct. 1, 2019

(54) BATTERY MONITORING SYSTEM

(71) Applicant: DENSO CORPORATION, Kariya, Aichi-pref. (JP)

(72) Inventor: Takumi Shimizu, Kariya (JP)

(73) Assignee: DENSO CORPORATION, Kariya (JP)

( * ) Notice: Subject to any disclaimer, the term of this patent is extended or adjusted under 35 U.S.C. 154(b) by 122 days.

(21) Appl. No.: 15/650,225

(22) Filed: Jul. 14, 2017

(65) Prior Publication Data
US 2018/0017627 A1  Jan. 18, 2018

(30) Foreign Application Priority Data

Jul. 14, 2016  (JP) ................................ 2016-139547

(51) Int. Cl.

| H02J 7/00 | (2006.01) |
|---|---|
| G01R 31/00 | (2006.01) |
| H01M 10/00 | (2006.01) |
| G01R 31/382 | (2019.01) |
| G01R 31/36 | (2019.01) |
| G01R 31/371 | (2019.01) |
| G01R 19/25 | (2006.01) |
| H01M 10/44 | (2006.01) |

(Continued)

(52) U.S. Cl.
CPC ....... *G01R 31/382* (2019.01); *G01R 19/2506* (2013.01); *G01R 31/36* (2013.01); *G01R 31/3648* (2013.01); *G01R 31/371* (2019.01); *H01M 10/441* (2013.01); *H01M 10/482* (2013.01); *H02J 7/0008* (2013.01); *H02J 7/0013* (2013.01); *G01R 31/396* (2019.01); *H01M 10/48* (2013.01); *H01M 10/625* (2015.04); *H01M 2010/4271* (2013.01); *H01M 2220/20* (2013.01); *H02J 7/0004* (2013.01)

(58) Field of Classification Search
None
See application file for complete search history.

(56) References Cited

U.S. PATENT DOCUMENTS

| 6,768,310 B2 * | 7/2004 | Yugo | G01R 19/0092 324/117 R |
|---|---|---|---|
| 2002/0063546 A1 | 5/2002 | Takahashi et al. | |
| 2018/0050681 A1 * | 2/2018 | Ohkawa | G01R 31/3624 |

FOREIGN PATENT DOCUMENTS

JP  2015-201948 A  11/2015

* cited by examiner

*Primary Examiner* — Leigh M Garbowski
(74) *Attorney, Agent, or Firm* — Oliff PLC

(57) ABSTRACT

A battery monitoring system monitors a storage battery. The system includes a voltage detection section that detects voltage across terminals of the storage battery, a current detection section that detects charging/discharging current flowing to the storage battery, a first obtainment section that obtains a detection value of the voltage across the terminals and a detection value of the charging/discharging current so as to be associated with each other, at predetermined synchronization periods, a battery control section that controls the storage battery based on the detection value of the voltage across the terminals and the detection value of the charging/discharging current, a second obtainment section that obtains the detection value of the charging/discharging current at a plurality of time points in the predetermined synchronization period, and an average value calculation section that calculates an average value of the detection values of the charging/discharging current obtained at the plurality of time points.

7 Claims, 4 Drawing Sheets

(51) Int. Cl.
*H01M 10/48* (2006.01)
*H01M 10/42* (2006.01)
*H01M 10/625* (2014.01)
*G01R 31/396* (2019.01)

US 10,429,446 B2

BATTERY MONITORING SYSTEM

CROSS-REFERENCE TO RELATED APPLICATION

This application is based on and claims the benefit of priority from earlier Japanese Patent Application No. 2016-139547 filed Jul. 14, 2016, the description of which is incorporated herein by reference.

BACKGROUND

Technical Field

The present invention relates to a battery monitoring system that monitors a storage battery.

Related Art

In a system detecting a current flowing to a storage battery or a voltage of the storage battery, there is a concern that a detection value may be lower or higher than a true value due to so-called aliasing when a detection period and a noise period are synchronized with each other or when the detection period is longer than the noise period. For example, JP-A-2015-201948 discloses a technique for reducing adverse effects of aliasing when voltage of a storage battery is detected.

Typically, when a storage battery is controlled, a detection value of voltage across terminals of the storage battery and a detection value of charging/discharging current are obtained in synchronization with each other at each predetermined synchronization period, and the charging rate or the like of the storage battery is adjusted by using the obtained detection values. In addition, for example, to obtain charging/discharging electrical power of the storage battery, the control for calculating an average value of the detection values of the charging/discharging current of the storage battery is performed. If the synchronization period determined based on, for example, the time required for detecting voltage across the terminals is longer than the period of a ripple (noise) generated in the charging/discharging current, when an average value of the detection values of the charging/discharging current is calculated, there is a concern that the calculated average value may be lower or higher than a true value due to adverse effects of aliasing.

SUMMARY

An embodiment provides a battery monitoring system that reduces adverse effects due to aliasing.

As a first aspect of the embodiment, a battery monitoring system monitors a storage battery. The battery monitoring system includes: a voltage detection section that detects voltage across terminals of the storage battery; a current detection section that detects charging and discharging current flowing to the storage battery; a first obtainment section that obtains a detection value of the voltage across the terminals detected by the voltage detection section and a detection value of the charging and discharging current detected by the current detection section so as to be associated with each other, at predetermined synchronization periods; a battery control section that controls the storage battery based on the detection value of the voltage across the terminals and the detection value of the charging and discharging current obtained by the first obtainment section so as to be associated with each other; a second obtainment section that obtains the detection value of the charging and discharging current detected by the current detection section at a plurality of time points in the predetermined synchronization period; and an average value calculation section that calculates an average value of the detection values of the charging and discharging current obtained by the second obtainment section at the plurality of time points.

DETAILED DESCRIPTION OF THE PREFERRED EMBODIMENTS

First Embodiment

Hereinafter, the first embodiment will be described in which a battery monitoring system is applied to a vehicle (e.g. hybrid automobile or electrical automobile) including a rotary electric machine as an in-vehicle traction unit, with reference to the drawings.

Figure 1:
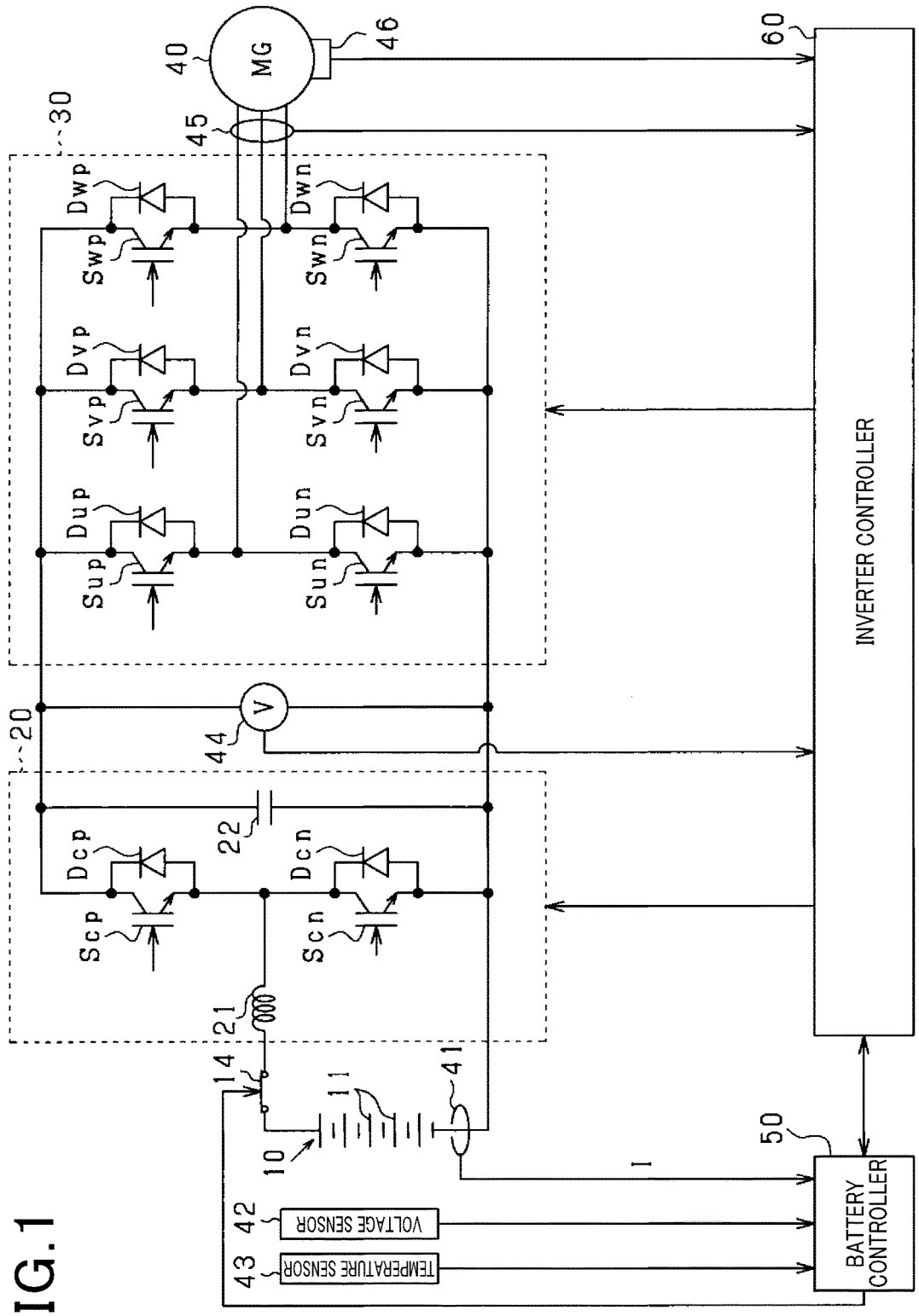
FIG. 1 is a diagram showing an electrical configuration of a first embodiment.

As shown in FIG. 1, an in-vehicle motor control system of the present embodiment includes an assembled battery 10, a boost converter 20, an inverter 30, a motor generator 40, and controllers 50 and 60.

The assembled battery 10 is electrically connected to the motor generator 40 via the boost converter 20 and the inverter 30. The assembled battery 10 is a storage battery having voltage across terminals thereof, for example, of 100V or more, and is configured by a plurality of battery modules 11 connected in series. Each of the battery modules 11 is configured by a plurality of battery cells connected in series. The battery cell may be, for example, a lithium-ion storage cell or a nickel-hydrogen storage cell. The battery module 11 corresponds to a storage battery.

The motor generator 40 is an in-vehicle traction unit. Power can be transferred between the motor generator 40 and driving wheels, not shown. In the present embodiment, a three-phase permanent magnet synchronous motor is used as the motor generator 40.

The boost converter 20 includes a reactor 21, a smoothing capacitor 22, and a series connection of upper and lower arm boost switches Scp and Scn. The boost converter 20 has a function of increasing output voltage of the assembled battery 10 up to a predetermined voltage. In the present embodiment, as the boost switches Scp and Scn, voltage control type semiconductor switching elements, specifically IGBTs (insulated gate bipolar transistor), are used. The boost switches Scp and Scn are respectively connected with free wheel diodes Dcp and Dcn in antiparallel.

The inverter 30 includes three series connections of U, V, W-phase upper arm switch Sup, Svp, Swp and U, V, W-phase lower arm switch Sun, Svn, Swn. Each of the series connections is connected to the smoothing capacitor 22 in parallel. Connecting points of the series connections are connected with respective ends of U, V, W-phase windings of the motor generator 40. In the present embodiment, as the switches Sup, Svp, and Swp, voltage control type semiconductor switching elements, specifically IGBTs, are used. The switches Sup, Sun, Svp, Svn, Swp, and Swn are respectively connected with free wheel diodes Dup, Dun, Dvp, Svn, Dwp and Dwn in antiparallel.

The battery controller 50 obtains a detection value of charging/discharging current (charging and discharging current) I flowing from a current sensor 41 (current detection section) to the assembled battery 10 (i.e. the battery modules 11), detection values of voltage across terminals of the respective battery modules 11 configuring the assembled battery 10 from a voltage sensor 42, and detection values of temperatures of the respective battery modules 11 from a temperature sensor 43. The battery controller 50 calculates charging rates of the respective battery modules 11 based on the obtained detection values. The battery controller 50 is configured by a CPU, a ROM, a RAM, and the like.

When overdischarge, overcharge, or an abnormal rise in temperature has occurred in any of the battery modules 11, the battery controller 50 turns off a relay 14 provided between the assembled battery 10 and the boost converter 20 to stop charging or discharging of the assembled battery 10.

The inverter controller 60 obtains a detection value of output voltage of the boost converter 20 from a voltage sensor 44, detection values of output voltage of respective phases of the inverter 30 from a phase current sensor 45, and a detection value of a rotation angle of the motor generator 40 from a rotation angle sensor 46 provided to the motor generator 40. In addition, the inverter controller 60 communicates with the battery controller 50, and obtains the detection value of the charging/discharging current I of the assembled battery 10, the detection values of the voltage across terminals of the respective battery modules 11, the detection values of the temperatures of the respective battery modules 11, and calculation values of the charging rates of the respective battery modules 11.

The inverter controller 60 performs on-off control of the switches Scp and Scn of the boost converter 20 and on-off control of the switches Sup, Sun, Svp, Svn, Swp, and Swn of the inverter 30. The inverter controller 60 is configured by a CPU, a ROM, a RAM, and the like.

In the present embodiment, the voltage sensor 42, which serves as a voltage detection section, performs voltage detection using a flying capacitor system (method). The voltage detection using the flying capacitor system will be described with reference to FIG. 2.

Figure 2:
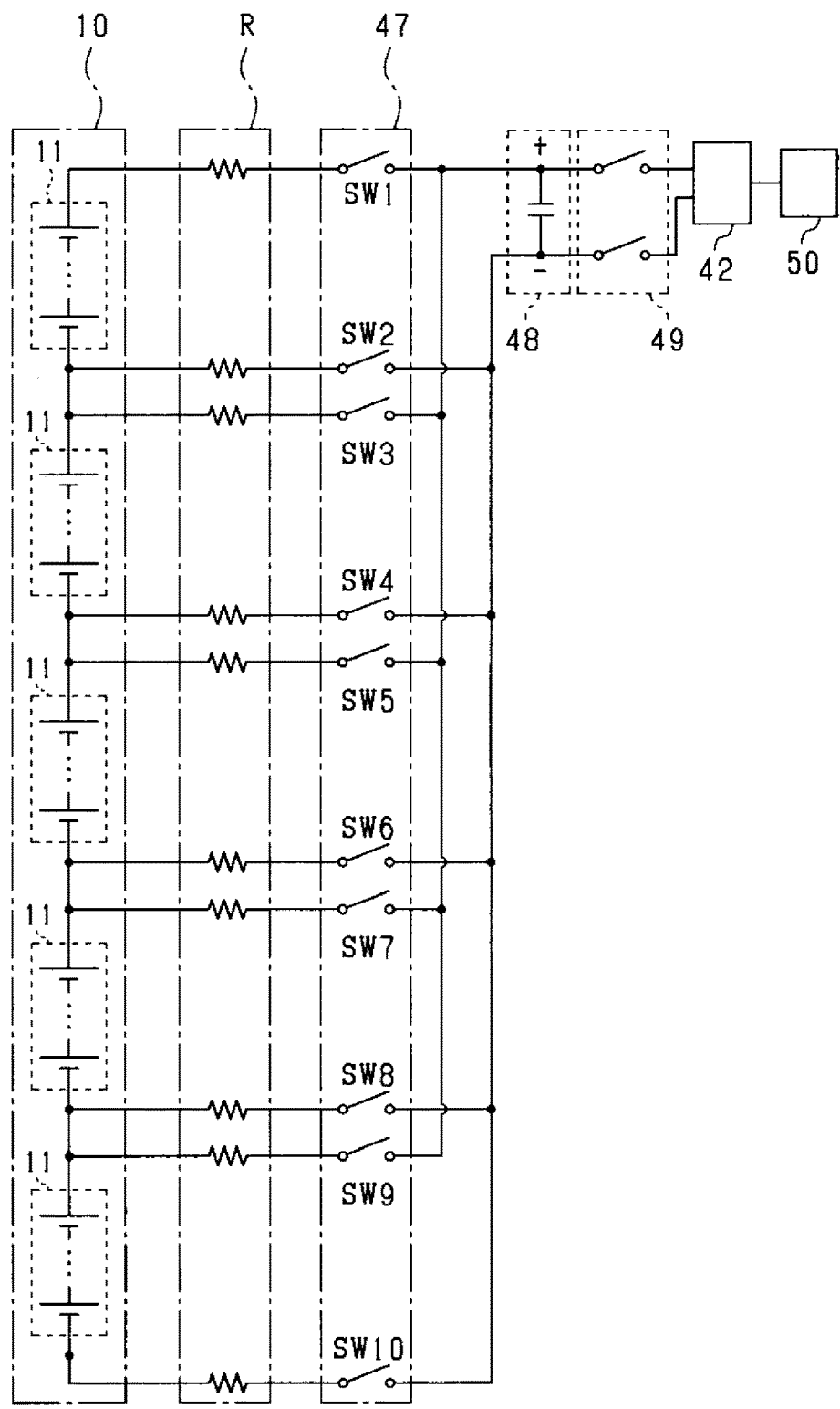
FIG. 2 is a diagram illustrating voltage detection using a flying capacitor system.

As shown in FIG. 2, the assembled battery 10 is configured by the five battery modules 11. There are provided, between the battery modules 11 and the voltage sensor 42, a plurality of resistor elements R, a multiplexer 47 including a plurality of input side switches SW1 to SW10, a capacitor 48, and an output side switch 49.

The battery controller 50 turns on the switch SWi (i=1, 3, 5, 7, 9) provided at the high voltage side of any of the battery modules 11 and the switch SWi+1 provided at the low voltage side of the battery module 11, in a state where the output side switch 49 is turned off, thereby connecting the corresponding battery module 11 and the capacitor 48. When the battery module 11 and the capacitor 48 are connected via the resistor elements R and the switches SWi and SWi+1, the capacitor 48 is charged by the voltage of the battery module 11. When charging the capacitor 48 is completed, the battery controller 50 turns off all the input side switches SW1 to SW10 and turns on the output side switch 49. Thereby, the voltage of the capacitor 48 is input to the voltage sensor 42 and is converted to a digital signal. Then, the battery controller 50 obtains the digital signal output from the voltage sensor 42 to detect a voltage of the battery module 11, which is a measurement object that has charged the capacitor 48.

In the voltage detection using the flying capacitor system, the time for charging the capacitor 48 is necessary to detect voltage across terminals of the respective battery modules 11. Hence, to once detect voltage across terminals of one battery module 11, the time corresponding to a time constant determined from a capacitance value of the capacitor 48 and a resistance value of the resistor elements R is necessary. In addition, to detect voltage across terminals of all the battery modules 11 configuring the assembled battery 10, the time corresponding to the product of the time, which corresponds to the time constant determined from a capacitance value of the capacitor 48 and a resistance value of the resistor element R, and the number of the battery modules 11.

The battery controller 50, which serves as a first obtainment section, obtains a detection value of the charging/discharging current I of the assembled battery 10 and detection values of voltage across terminals of the respective battery modules 11 so as to be associated with each other, at each predetermined synchronization period (each predetermined synchronization time). Then, the battery controller 50 calculates charging rates of the respective battery modules 11 based on the obtained and associated detection values. In addition, the inverter controller 60 performs control based on the average value of the detection values of the charging/discharging current I of the assembled battery 10.

When the average value of the detection values of the charging/discharging current I of the assembled battery 10 is calculated, effects due to aliasing cause a problem. That is, when a ripple has been caused in the charging/discharging current I flowing to the assembled battery 10, and if the detection period of the charging/discharging current I is longer than one half of the period of the ripple (i.e. if the sampling theorem is not met), aliasing is generated. The ripple in the charging/discharging current I flowing to the assembled battery 10 is caused due to the operation of the boost converter 20 connected with the assembled battery 10.

Specifically, in the voltage detection using the flying capacitor system, as described above, the time corresponding to a time constant determined from a capacitance value of the capacitor 48 and a resistance value of the resistor element R is necessary to once detect voltage across terminals of one battery module 11. Hence, the period (synchronization period) for obtaining a detection value of the charging/discharging current I in synchronization with the voltage detection becomes long, whereby aliasing is easily generated.

Figure 3:
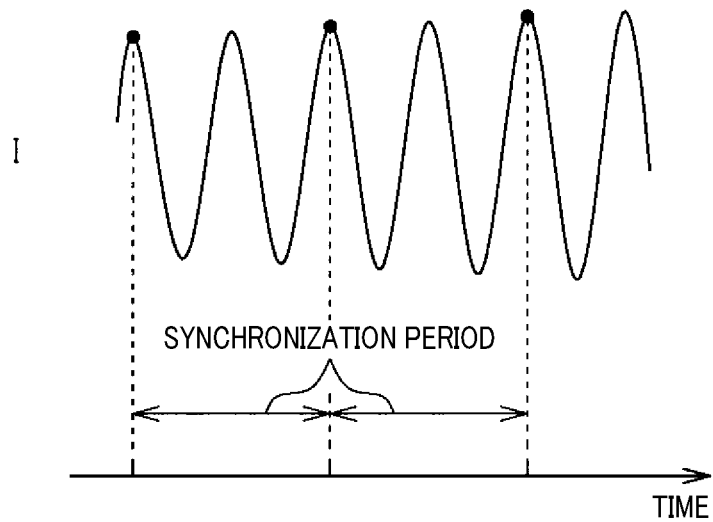
FIG. 3 is a diagram illustrating an effect of aliasing exerted on the calculation of an average value of charging/discharging current.

As shown in FIG. 3, due to aliasing, only values in the vicinity of the maximum value of the charging/discharging current I may be successively obtained as detection values, or only values in the vicinity of the minimum value of the charging/discharging current I may be successively obtained as detection values. As a result, there is a concern that the calculation value of the average value of the charging/discharging current I calculated based on the detection values of the charging/discharging current I may be higher or lower than a true value. Although it can be considered that an RC filter circuit is additionally provided to attenuate a ripple, the number of elements may increase, and the response to the variation of the charging/discharging current may become worse.

The battery controller 50, which also serves as a second obtainment section, obtains detection values of the charging/discharging current I of the current sensor 41 at a plurality of time points in the synchronization period. Then, the inverter controller 60 receives the detection values of the charging/discharging current I of the current sensor 41 obtained at the plurality of time points in the synchronization period, from the battery controller 50. The inverter controller 60, which serves as an average value calculation section, calculates an average value of the received detection values of the charging/discharging current I.

The battery controller 50 serving as the second obtainment section obtains detection values of the charging/discharging current I at the first time point and the second time point. At the first time point, a detection value of the charging/discharging current I is obtained in synchronization with the voltage detection. The time period between the first time point and the second time point is shorter than the synchronization period. The second time point changes so that the time period sequentially changes. According to this configuration, the sampling period of the detection values of the charging/discharging current I used for calculating an average value changes every time. Specifically, when the period of a ripple generated in the charging/discharging current I is substantially constant, adverse effects due to aliasing can be reduced.

In addition, the battery controller 50 performs predetermined processes for controlling the assembled battery 10 at each synchronization period (each synchronization time). Specifically, the predetermined processes for controlling the assembled battery 10 include a process for calculating an internal resistance of the battery module 11, a process for calculating a charging rate, and a process for communicating with another controller, such as the inverter controller 60, based on the detection value of the charging/discharging current I of the assembled battery 10, the detection values of voltage across terminals of the respective battery modules 11, and temperatures of the respective battery modules 11.

Figure 4:
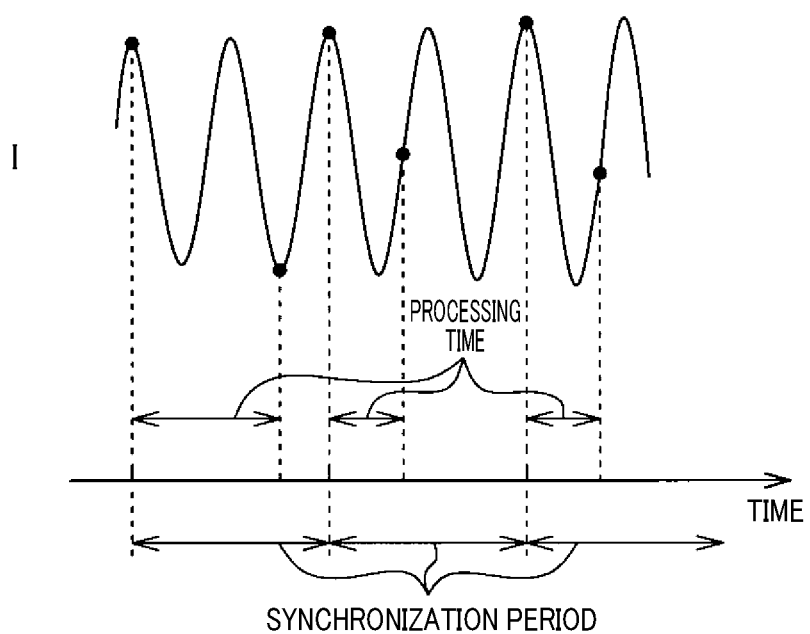
FIG. 4 illustrates obtainment of a detection value of charging/discharging current according to the first embodiment.

As shown in FIG. 4, the predetermined processes performed by the battery controller 50 at each synchronization period end at the second time point. At the first time point, a detection value of the charging/discharging current I is obtained in synchronization with the voltage detection. The time period between the first time point and the second time point is shorter than the synchronization period. The second time point changes according to the execution state of the predetermined processes. Hence, the battery controller 50 serving as the second obtainment section obtains detection values of the charging/discharging current I at the time point when a detection value of the charging/discharging current I is obtained in synchronization with the voltage detection and the time point when the predetermined processes end. Thereby, the sampling period for detection values of the charging/discharging current I used for calculating an average value can be changed every time with a simple configuration.

The battery controller 50 corresponds to a first unit that has functions of the first obtainment section and the second obtainment section, which obtain detection values of the charging/discharging current I of the assembled battery 10 from the current sensor 41, and a function of a battery control section. The inverter controller 60 has an average value calculation section and corresponds to a second unit different from the first unit.

The battery controller 50 has a function of a transmission section that transmits a plurality of detection values of the charging/discharging current I obtained during the synchronization period to the inverter controller 60 at predetermined communication periods (predetermined communication times). The battery controller 50 serving as the second obtainment section obtains detection values of the charging/discharging current I of the current sensor 41 at a plurality of time points in the communication period. Then, the battery controller 50 serving as the transmission section transmits the detection values of the charging/discharging current I obtained at the plurality of time points to the inverter controller 60, at each communication period (communication time).

If the battery controller 50 transmits only one detection value of the charging/discharging current to the inverter controller 60 at each communication period, there is a concern that aliasing may be generated because the period of a ripple of the charging/discharging current I is long. Hence, according to the present configuration, the battery controller 50 obtains detection values of the charging/discharging current I at a plurality of time points in the communication period and transmits the obtained plurality of detection values to the inverter controller 60. According to the present configuration, the period for obtaining detection values of the charging/discharging current I used for calculating an average value becomes shorter than the communication period. Thus, adverse effects due to aliasing can be reduced.

Second Embodiment

The electrical configuration of the second embodiment is the same as that of the first embodiment shown in FIGS. 1 and 2. In the second embodiment, the battery controller 50 serving as the second obtainment section obtains a detection value of the charging/discharging current I at predetermined periods that are shorter than synchronization period at which a detection value of the charging/discharging current I is obtained in synchronization with the voltage detection, thereby obtaining detection values of the charging/discharging current I at a plurality of time points in the synchronization period.

Figure 5:
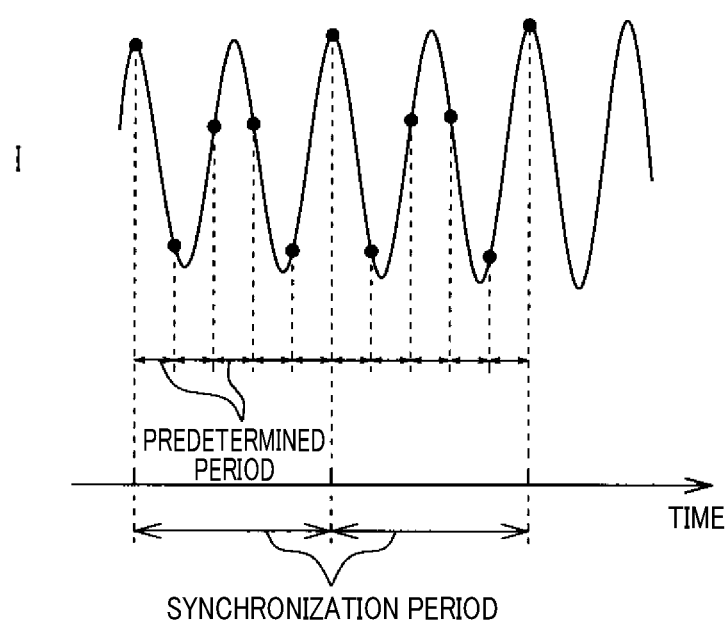
FIG. 5 illustrates obtainment of a detection value of charging/discharging current according to a second embodiment.

FIG. 5 illustrates a relationship between the synchronization period and the predetermined period. It is noted that phases at the timing when the charging/discharging current I is detected by the second obtainment section and the timing when the charging/discharging current I is detected by the first obtainment section may be different from each other. According to this configuration, the periods at which detection values of the charging/discharging current I used for calculating an average value are obtained become shorter than synchronization period, whereby adverse effects due to aliasing can be reduced.

In addition, the controller 50 serving as the second obtainment section transmits all the detection values of the charging/discharging current I obtained at a plurality of time points in the synchronization period, to the inverter controller 60. Then, the inverter controller 60 serving an average value calculation section calculates an average value of the detection values of the charging/discharging current I, whereby adverse effects due to aliasing can be reduced.

In addition, the battery controller 50 serving as the second obtainment section changes the predetermined period so as to be shortened on condition that a predetermined ripple has been generated in the charging/discharging current I. Hence, adverse effects due to aliasing can be reduced.

The battery controller 50 includes a $\Delta\Sigma$ type analog-digital converter, and obtains an analog value (voltage value) representing the magnitude of the charging/discharging current I input from the current sensor 41 to convert the analog value to a digital value. When the period for obtaining a detection value of the charging/discharging current I is changed so as to be shortened on condition that a predetermined ripple has been generated in the charging/discharging current I, the accuracy of the ΔΣ type analog-digital converter is temporarily lowered. For example, a 12 bit ΔΣ type analog-digital converter is temporarily operated using 8 bits. Hence, when the battery controller 50 obtains a detection value of the charging/discharging current I from the current sensor 41, the rate at which the detection value is obtained can be temporarily increased.

Third Embodiment

In the third embodiment, as in the case of the second embodiment, the controller 50 serving as the second obtainment section obtains a detection value of the charging/discharging current I at predetermined periods that are shorter than the synchronization period at which a detection value of the charging/discharging current I is obtained in synchronization with the voltage detection, thereby obtaining detection values of the charging/discharging current I at a plurality of time points in the synchronization period.

In addition, the controller 50 serving as the second obtainment section transmits all the detection values of the charging/discharging current I obtained at a plurality of time points in the synchronization period, to the inverter controller 60. Then, the inverter controller 60 of the third embodiment serving as the average value calculation section randomly extracts data from all the received detection values, and calculates an average value of the detection values of the charging/discharging current I based on the extracted detection values of the charging/discharging current I, whereby adverse effects due to aliasing can be reduced.

It is noted that the controller 50 serving as the transmission section may be configured to randomly extract data from all the obtained detection values and transmit the extracted detection values of the charging/discharging current I to the inverter controller 60.

Fourth Embodiment

The electrical configuration of the fourth embodiment is the same as that of the first embodiment shown in FIGS. 1 and 2. The controller 50 serving as the first unit communicates with the inverter controller 60 serving as the second unit at predetermined communication periods (communication times).

The battery controller 50 serving as the first obtainment section obtains a detection value of the voltage sensor 42 and a detection value of the current sensor 41 so as to be associated with each other at predetermined synchronization periods (synchronization times). The battery controller 50 serving the battery control section controls the assembled battery 10 based on the detection value of the voltage sensor 42 and the detection value of the current sensor 41.

The battery controller 50 serving as the second obtainment section obtains detection values of the current sensor 41 at a plurality of time points in the communication period. Then, the battery controller 50 serving as the transmission section transmits the detection values of the current sensor 41 obtained at the plurality of time points in the communication period to the inverter controller 60. The inverter controller 60 serving as the average value calculation section calculates an average value of the detection values of the current sensor 41 received from the battery controller 50.

More specifically, the battery controller 50 serving as the second obtainment section obtains detection values of the charging/discharging current I from the current sensor 41 at the first time point and the second time point. At the first time point, a detection value of the charging/discharging current I is obtained in synchronization with the voltage detection. The time period between the first time point and the second time point is shorter than the communication period. The second time point changes so that the time period sequentially changes. A detection value of the charging/discharging current I may be obtained at predetermined periods shorter than the communication period, to obtain detection values of the charging/discharging current I at a plurality of time points in the communication period.

According to the configuration of the present embodiment, an average value of the charging/discharging current I is calculated based on a plurality of detection values obtained at periods shorter than the communication period. Thus, adverse effects due to aliasing can be reduced.

Other Embodiments

The functions of the average value calculation section may be included in the battery controller 50. That is, the battery controller 50 may calculate an average value of the charging/discharging current I based on detection values of the charging/discharging current I of the current sensor 41 obtained at a plurality of time points in the synchronization period. Then, the battery controller 50 may transmit the calculated average value of the charging/discharging current I to the inverter controller 60. According to the configuration of the present modification, the number of processes of the battery controller 50 increases, whereas the number of processes of the inverter controller 60 can be decreased. In addition, the amount of information transmitted from the battery controller 50 to the inverter controller 60 can be decreased.

In the first embodiment, the controller 50 serving as the second obtainment section obtains detection values of the charging/discharging current I at the time point when a detection value of the charging/discharging current I is obtained in synchronization with the voltage detection and the time point when the predetermined processes end. Alternatively, the controller 50 serving as the second obtainment section may obtain detection values of the charging/discharging current I at the first time point and the second time point. At the first time point, a detection value of the charging/discharging current I is obtained in synchronization with the voltage detection. The time period between the first time point and the second time point is shorter than the synchronization period. The second time point changes so that the time period randomly changes. The random time period may be set by using a random function generating random numbers.

In the above embodiment, the battery module 11 is used as a storage battery. However, for example, a battery cell may be used as the storage battery.

The voltage detection of the battery module 11 may be performed using a resistive voltage dividing system (method) instead of the flying capacitor system.

It will be appreciated that the present invention is not limited to the configurations described above, but any and all modifications, variations or equivalents, which may occur to those who are skilled in the art, should be considered to fall within the scope of the present invention.

Hereinafter, aspects of the above-described embodiments will be summarized.

As a first aspect of the embodiment, a battery monitoring system monitors a storage battery. The battery monitoring system includes: a voltage detection section (42) that detects voltage across terminals of the storage battery; a current detection section (41) that detects charging/discharging current flowing to the storage battery; a first obtainment section (50) that obtains a detection value of the voltage across the terminals detected by the voltage detection section and a detection value of the charging/discharging current detected by the current detection section so as to be associated with each other, at predetermined synchronization periods; a battery control section (50) that controls the storage battery based on the detection value of the voltage across the terminals and the detection value of the charging/discharging current obtained by the first obtainment section so as to be associated with each other; a second obtainment section (50) that obtains the detection value of the charging/discharging current detected by the current detection section, at a plurality of time points in the predetermined synchronization period; and an average value calculation section (50, 60) that calculates an average value of the detection values of the charging/discharging current obtained by the second obtainment section at the plurality of time points.

To control the storage battery, it is required to obtain a detection value of the voltage across the terminals of the storage battery and a detection value of the charging/discharging current flowing to the storage battery so as to be associated with each other, and to perform the control based on the associated detection value of the voltage across the terminals and detection value of the charging/discharging current. In addition, a ripple is generated in the charging/discharging current of the storage battery storage battery due to, for example, capacitive components of loads connected to the storage battery.

When an average value of the charging/discharging current is calculated, there is a concern that aliasing may be generated because the synchronization period for the detection values of the voltage across the terminals and the charging/discharging current obtained for the battery control is longer than the period of the ripple of the charging/discharging current. That is, when the charging/discharging current is detected, there is a concern that the calculated average value of the charging/discharging current may become larger than an actual value because only values in the vicinity of the maximum value of the ripple are obtained, and may become smaller than the actual value because only values in the vicinity of the minimum value of the ripple are obtained. Although it can be considered that an RC filter circuit may be additionally provided to attenuate a ripple, the number of elements may increase, and the response to the variation of the charging/discharging current may become worse.

Thus, in the first aspect, the detection value of the charging/discharging current is detected at a plurality of time points in the synchronization period, and an average value of the obtained plurality of detection values is calculated. According to the first aspect, the period for obtaining detection values of the charging/discharging current used for calculating an average value becomes shorter than the synchronization period. Thus, adverse effects due to aliasing can be reduced.

As a second aspect of the embodiment, in the first aspect, the battery detection section performs voltage detection using a flying capacitor system.

The voltage detection using a flying capacitor system differs from the voltage detection using a resistive voltage dividing system in that an additional insulated power supply is not required. However, the voltage detection using a flying capacitor system has an disadvantage in that voltage cannot be detected earlier than the time constant determined from the capacitance of a flying capacitor or the like. That is, the period of the voltage detection becomes close to the time constant determined from the capacitance of a flying capacitor or the like. According to the configuration, the synchronization period, which is a period for detecting voltage across terminals by the first obtainment section, becomes long, whereby the period for detecting the charging/discharging current by the first obtainment section becomes long. Thus, an effect of aliasing mainly caused by the ripple current described above becomes large.

As a third aspect of the embodiment, in the first or second aspect, the second obtainment section obtains the detection values of the charging/discharging current at a first time point and a second time point. At the first time point, the detection value of the charging/discharging current is obtained by the first obtainment section. A time period between the first time point and the second time point is shorter than the synchronization period. The second time point changes so that the time period sequentially changes.

The detection values of the charging/discharging current are obtained at the first time point and the second time point. At the first time point, the detection value of the charging/discharging current is obtained by the first obtainment section. The time period between the first time point and the second time point is shorter than the synchronization period. The second time point changes so that the time period sequentially changes (that is, the second time point is a random time point in the synchronization period). Then, an average value of the obtained detection values of the charging/discharging current is calculated. According to this configuration, the sampling period for the detection values of the charging/discharging current used for calculating the average value changes every time. Specifically, when the period of a ripple generated in the charging/discharging current is substantially constant, adverse effects due to aliasing can be reduced.

As a fourth aspect of the embodiment, in the third aspect, the battery control section performs a predetermined process for controlling the storage battery at the synchronization periods, the first obtainment section obtains the detection value of the charging/discharging current at the first time point, the predetermined process ends at the second time point, the time period between the first time point and the second time point is shorter than the synchronization period and changes according to an execution state of the predetermined process, and the second obtainment section obtains the detection values of the charging/discharging current at the first time point and the second time point.

The predetermined process for controlling the storage battery is performed at the synchronization periods, and the period for the predetermined process sequentially changes. Hence, the time point when the predetermined process ends is regarded as the second time point. At the first time point, the detection value of the charging/discharging current is obtained. The time period between the first time point and the second time point is shorter than the synchronization period. The second time point changes so that the time period sequentially changes. Thereby, the sampling period for detection values of the charging/discharging current used for calculating an average value can be changed every time with a simple configuration.

As a fifth aspect of the embodiment, in the first or second aspect, the second obtainment section obtains the detection value of the charging/discharging current at predetermined periods shorter than the synchronization period to obtain the detection value of the charging/discharging current at the plurality of time points in the synchronization period.

The second obtainment section obtains a detection value of the charging/discharging current at a time point when the first obtainment section obtains a detection value of the charging/discharging current, and obtains a detection value of the charging/discharging current at predetermined periods shorter than the synchronization period at which the detection value of the charging/discharging current is obtained by the first obtainment section. Then, the second obtainment section calculates an average value of the detection values of the charging/discharging current based on the obtained detection values of the charging/discharging current. According to the configuration, the period for obtaining detection values of the charging/discharging current used for calculating an average value becomes shorter than the synchronization period. Thus, adverse effects due to aliasing can be reduced.

As a sixth aspect of the embodiment, in the fifth aspect, the second obtainment section changes the predetermined period so as to be shortened on condition that a predetermined ripple has been generated in the charging/discharging current.

By changing the predetermined period, which is a period for obtaining a detection value of the charging/discharging current by the second obtainment section, so as to be shortened on condition that a predetermined ripple has been generated, adverse effects due to aliasing can be reduced.

As a seventh aspect of the embodiment, in any of the first to sixth aspects, the battery monitoring system includes: a first unit that has the first obtainment section, the second obtainment section, and the battery control section; and a second unit that has the average value calculation section and is different from the first unit. The first unit has a transmission section (50) that transmits the detection value of the charging/discharging current obtained by the second obtainment section to the second unit at predetermined communication periods. The second obtainment section obtains the detection value of the charging/discharging current detected by the current detection section, at a plurality of time points in the communication period. The transmission section transmits the detection values of the charging/discharging current obtained by the second obtainment section, at the plurality of time points, to the second unit.

In the configuration in which the first unit includes the second obtainment section and the second unit includes the average value calculation section, if only one detection value of the charging/discharging current is transmitted at each communication period, there is a concern that aliasing may be generated because the period of a ripple of the charging/discharging current is long. Hence, according to the present configuration, the first unit obtains detection values of the charging/discharging current at a plurality of time points in the communication period and transmits the obtained plurality of detection values to the second unit. According to the configuration, the period for obtaining detection values of the charging/discharging current used for calculating an average value becomes shorter than the communication period. Thus, adverse effects due to aliasing can be reduced.

As an eighth aspect of the embodiment, a battery monitoring system monitors a storage battery. The battery monitoring system includes: a voltage detection section (42) that detects voltage across terminals of the storage battery; a current detection section (41) that detects charging/discharging current flowing to the storage battery; and a first unit (50) and a second unit (60) that perform communication at predetermined communication periods. The first unit includes: a first obtainment section that obtains a detection value of the voltage across the terminals detected by the voltage detection section and a detection value of the charging/discharging current detected by the current detection section so as to be associated with each other, at predetermined synchronization periods; a battery control section that controls the storage battery based on the detection value of the voltage across the terminals and the detection value of the charging/discharging current obtained by the first obtainment section so as to be associated with each other; a second obtainment section that obtains the detection values of the charging/discharging current detected by the current detection section, at a plurality of time points in the communication period; and a transmission section that transmits the detection values of the charging/discharging current obtained by the second obtainment section to the second unit, at the communication periods. The second unit includes an average value calculation section that calculates an average value of the detection values of the charging/discharging current received from the transmission section.

To control the storage battery, it is required to obtain a detection value of the voltage across the terminals of the storage battery and a detection value of the charging/discharging current flowing to the storage battery so as to be associated with each other, and to perform the control based on the associated detection value of the voltage across the terminals and detection value of the charging/discharging current. In addition, a ripple is generated in the charging/discharging current of the storage battery due to, for example, capacitive components of loads connected to the storage battery.

When an average value of the charging/discharging current is calculated, there is a concern that aliasing may be generated because the communication period between the first unit that obtains the detection value of the charging/discharging current and the second unit that calculates the average value is longer than the period of the ripple of the charging/discharging current. That is, there is a concern that the calculated average value of the charging/discharging current may become larger than an actual value because only values in the vicinity of the maximum value of the ripple are transmitted from the first unit to the second unit, and may become smaller than the actual value because only values in the vicinity of the minimum value of the ripple are transmitted from the first unit to the second unit.

Thus, the first unit obtains the detection value of the charging/discharging current at a plurality of time points in the communication period, and transmits the obtained plurality of detection values to the second unit. In addition, the second unit calculates an average value based on the plurality of detection values. According to the configuration, the average value of the charging/discharging current is calculated based on the plurality of detection values obtained in a period shorter than the communication period. Thus, adverse effects due to aliasing can be reduced.

What is claimed is:

1. A battery monitoring system for monitoring a storage battery, the battery monitoring system comprising:
   a voltage detection section that is configured to detect voltage across terminals of the storage battery;
   a current detection section that is configured to detect charging and discharging current flowing to and from the storage battery;
   a first obtainment section that is configured to (a) obtain (1) a voltage detection value of the voltage across the terminals detected by the voltage detection section and (2) a current detection value of the charging and discharging current detected by the current detection section and (b) associate the voltage detection value and the current detection value during predetermined time synchronization periods;

a battery control section that is configured to control the storage battery based on the voltage detection value and the current detection value obtained by the first obtainment section;

a second obtainment section that is configured to obtain the current detection value at a plurality of time points during each of the predetermined time synchronization periods;

an average value calculation section that is configured to calculate an average value of the current detection values obtained by the second obtainment section at the plurality of time points; and a controller that is configured to use the average value of the current detection values to control in part the storage battery; wherein:

the battery control section is configured to perform a predetermined process for controlling the storage battery during the each of the predetermined time synchronization periods;

the first obtainment section is configured to obtain the current detection at a first time point of the plurality of time points during the each of the predetermined time synchronization periods;

the predetermined process ends at a second time point of the plurality of time points during the each of the predetermined time synchronization periods, the second time point being subsequent to the first time point; and a time period between the first time point and the second time point is shorter than the predetermined time synchronization periods and changes according to an execution state of the predetermined process.

2. The battery monitoring system according to claim 1, wherein
the voltage detection section is configured to perform voltage detection using a flying capacitor system.

3. The battery monitoring system according to claim 1, wherein the second time point changes so that the time period sequentially changes.

4. The battery monitoring system according to claim 1, wherein
the second obtainment section is configured to obtain the current detection value at predetermined periods that are shorter than the each of the predetermined time synchronization periods to obtain the current detection value at the plurality of time points in the each of the predetermined time synchronization periods.

5. The battery monitoring system according to claim 4, wherein
the second obtainment section is configured to change the predetermined periods so as to be shortened on condition that a predetermined ripple has been generated in the charging and discharging current.

6. The battery monitoring system according to claim 1, further comprising:
a first unit that has the first obtainment section, the second obtainment section, and the battery control section; and
a second unit that has the average value calculation section and is different from the first unit, wherein the first unit has a transmission section that is configured to transmit the current detection value obtained by the second obtainment section to the second unit, at predetermined communication periods, the second obtainment section is configured to obtain the current detection value of at a plurality of time points in the each of the communication periods, and the transmission section is configured to transmit the current detection values obtained by the second obtainment section, at the plurality of time points, to the second unit.

7. A battery monitoring system for monitoring a storage battery, the battery monitoring system comprising:
a voltage detection section that is configured to detect voltage across terminals of the storage battery;
a current detection section that is configured to detect charging and discharging current flowing to and from the storage battery; and
a first unit and a second unit that are configured to communicate with each other at predetermined communication periods, wherein
the first unit includes:
a first obtainment section that is configured to (a) obtain (1) a voltage detection value of the voltage across the terminals detected by the voltage detection section and (2) a current detection value of the charging and discharging current detected by the current detection section and (b) associate the voltage detection value and the current detection value during predetermined time synchronization periods;
a battery control section that is configured to control the storage battery based on the voltage detection value and the current detection value obtained by the first obtainment section;
a second obtainment section that is configured to obtain the current detection value at a plurality of time points in each of the predetermined time synchronization periods, and
a transmission section that is configured to transmit the current detection values obtained by the second obtainment section to the second unit during the each of the predetermined communication periods;
the second unit includes (1) an average value calculation section that is configured to calculate an average value of the current detection values received from the transmission section and (2) a controller that is configured to use the average value of the current detection values to control in part the storage battery;
the battery control section is configured to perform a predetermined process for controlling the storage battery during the each of the predetermined time synchronization periods;
the first obtainment section is configured to obtain the current detection at a first time point of the plurality of time points during the each of the predetermined time synchronization periods;
the predetermined process ends at a second time point of the plurality of time points during the each of the predetermined time synchronization periods, the second time point being subsequent to the first time point; and
a time period between the first time point and the second time point is shorter than the predetermined synchronization periods and the changes according to an execution state of the predetermined process.

* * * * *